United States Patent [19]

Holland et al.

[11] Patent Number: 5,667,631

[45] Date of Patent: Sep. 16, 1997

[54] DRY ETCHING OF TRANSPARENT ELECTRODES IN A LOW PRESSURE PLASMA REACTOR

[75] Inventors: John P. Holland, Santa Clara; Alex T. Demos, San Francisco, both of Calif.

[73] Assignee: Lam Research Corporation, Fremont, Calif.

[21] Appl. No.: 672,724

[22] Filed: Jun. 28, 1996

[51] Int. Cl.$^6$ .................. B01J 15/00; C23F 1/02
[52] U.S. Cl. .................. 216/13; 216/76; 216/63; 156/345; 438/22
[58] Field of Search .................. 216/68, 76; 156/643.1, 156/646.1, 345; 257/449

[56] References Cited

U.S. PATENT DOCUMENTS

| | | | |
|---|---|---|---|
| 4,878,993 | 11/1989 | Rossi et al. | 156/643.1 |
| 5,153,142 | 10/1992 | Hsieh | 437/40 |
| 5,171,401 | 12/1992 | Roselle | 156/643.1 |
| 5,286,337 | 2/1994 | Tsou | 156/643.1 |
| 5,318,664 | 6/1994 | Saia et al. | 156/643.1 |

OTHER PUBLICATIONS

Jeong, Hyun Kim, Sung Il Park, Ki Hyun Ryu, Gyu Hyeon Lee, and Chan Hee Hong, *"Interaction Between Cr and $Cl_2$ Gas in TFT-Array Fabrication,"* LG Electronics, Inc., 533 Hogaedong, Anyangshi, 430-080 Korea, pp. 85-86.

C. Barratt, C. Constantine, D. Johnson, and W. Barrow, *"Dry-Etching of Indium Tin Oxide for Flat-Panel-Display Fabrication,"* Plasma-Therm, Inc., St. Petersburg, FL and Planar Systems, Beaverton, OR, 30.3

Masaru Takabatake, Youkou Wakui, and Nobutake Konishi, *"Ito Dry Etching Using HBr Gas For TFT-LCD's,"* (Dry Etch Symposium) P3-4, pp. 200-203, Hitachi Research Lab, Hitachi, Ltd., 7-1-1, Omica-cho, Hitachi-shi, Ibaraki-ken, 319-12, Japan.

R.J. Saia, R.F. Kwasnick, and C.Y. Wei, *"Selective Reactive Ion Etching of Indium-Tin Oxide in a Hydrocarbon Gas Mixture,"* J. Electrochem. Soc. vol. 138, No. 2, (Feb. 1991), pp. 493-496.

J. Malloy, P. Maguire, S.J. Laverty, and J.A. McLaughlin, *"The Reactive Ion Etching of Transparent Electrodes for Flat Panel Displays Using $Ar/Cl_2$ Plasmas,"* J. Electrochem Soc., vol. 142., No. 12, (Dec. 1995), pp. 4285-4289.

S.A. Knickerbocker and A.K. Kulkarni, *"Calculation of the Figure of Merit for Indium Tin Oxide Films Based on Basic Theory,"* J. Vac. Sci. Technol. A, vol. 13, No. 3, (May 1995, Jun. 1995), pp. 1048-1052.

L.Y. Tsou, *"Reactive Ion Etching of Indium Tin Oxide with Hydrogen Bromide,"* J. Electrochem. Soc., vol. 140, No. 10, (Oct. 1993), pp. 2965-2969.

*Primary Examiner*—R. Bruce Breneman
*Assistant Examiner*—Michael E. Adjodha
*Attorney, Agent, or Firm*—Hickman Peyer & Weaver

[57] ABSTRACT

A method for dry etching an indium tin oxide (ITO) layer disposed above a substrate in a low pressure plasma reactor is disclosed. The method includes a step of placing a substrate having the ITO layer into the low pressure plasma reactor, a step of introducing an etchant gas into the low pressure plasma reactor; a step of striking a plasma from the etchant gas in the low pressure plasma reactor; and a step of etching the ITO layer with the plasma.

48 Claims, 5 Drawing Sheets

| PARAMETERS | POSSIBLE RANGES |
|---|---|
| ITO ETCH RATE (Å/min) | 4000 |
| SELECTIVITY OF ITO TO PHOTORESIST | 3:1 |
| SELECTIVITY OF ITO TO SILICON NITRIDE | 10:1 |
| SELECTIVITY OF ITO TO GLASS | 10:1 |
| ETCH RATE UNIFORMITY | 5% WITHIN THE MEAN ETCH RATE |
| ETCH PROFILE | 45-90° TAPER ANGLE |

| PARAMETERS | BROAD RANGE | PREFERRED RANGE | MORE PREFERRED RANGE |
|---|---|---|---|
| PRESSURE (milliTorr) | .1 to 100 | 3 to 15 | 5 |
| PLASMA DENSITY ($cm^{-3}$) | E10 to E12 | 5E10 to 5E11 | E11 |
| RF Bias Power (Watts) ($Watts/cm^2$ of substrate) | 100 to 4000<br>0.09 to 3.7 | 500 to 2500<br>0.46 to 2.30 | 1250<br>1.15 |
| FLOW RATE (sccm) ($sccm/cm^2$ of substrate) | 40 to 2000<br>0.04 to 1.84 | 100 to 1000<br>0.092 to 0.92 | 200<br>0.18 |
| OPTIONAL | | | |
| TEMPERATURE (°C) | Less than 80 | 40 to 80 | 40 |
| SOURCE ETCHANT GAS (milliTorr) | HBr, HCl, HI, $Cl_2$, with additives such as oxygen, chlorine accounting for 5–10% of the total flow rate. | HBr or HI with additives such as oxygen, chlorine accounting for 5–10% of the total flow rate. | HBr with $O_2$ as an additive and accounting for 10% of the total flow rate. |

Fig. 3

| PARAMETERS | POSSIBLE RANGES |
|---|---|
| ITO ETCH RATE (Å/min) | 4000 |
| SELECTIVITY OF ITO TO PHOTORESIST | 3:1 |
| SELECTIVITY OF ITO TO SILICON NITRIDE | 10:1 |
| SELECTIVITY OF ITO TO GLASS | 10:1 |
| ETCH RATE UNIFORMITY | 5% WITHIN THE MEAN ETCH RATE |
| ETCH PROFILE | 45–90° TAPER ANGLE |

Fig. 4

DRY ETCHING OF TRANSPARENT ELECTRODES IN A LOW PRESSURE PLASMA REACTOR

BACKGROUND OF THE INVENTION

The present invention relates to the etching of an indium tin oxide (ITO) layer in a plasma reactor. More particularly, the present invention relates to an improved method for dry etching portions of an ITO layer in a low pressure, high density plasma reactor, such as a transformer coupled plasma (TCP™) reactor.

The popularity of indium tin oxide (ITO), which comprises tin oxide doped with indium, in the manufacture of optical devices and integrated circuits (ICs) may be attributed to its high electric conductivity and good optical transmittance. Early on, ITO films were commonly employed in transparent electric heaters for aircraft windows and antistatic coatings on instrument panels. Its use has expanded since and now includes antireflection coatings, heat reflecting mirrors, transparent electromagnetic shield coatings, transparent electrodes, and optoelectronic and photovoltaic devices such as heterojunction solar cells, transparent electrodes for various electrical devices such as photodetectors, and optical waveguides. For more information on the various applications of ITO, see for example, S.A. Knickerbocker and A. K. Kulkarni "Calculation Of The Figure Of Merit For Indium Tin Oxide Films Based On Basic Theory" J. Vac. Sci. Technology., Vol. 13, No. 3, pp.1048–1052 (1995).

One of the more notable areas of applications has been in the manufacture of flat panel displays, e.g., for wall mount televisions or laptop computers, thin film transistor-liquid crystal displays such as high resolution monitors, viewfinders, fine-pixel projectors, and the like. For discussion purposes, a cross sectional diagram of a representative panel portion 100 containing a layer of ITO is shown in FIG. 1A. Panel portion 100, which represents a portion of a flat panel display may include a glass substrate 106. Glass substrate 106 may represent, for example, a 320×340 mm² Dow Corning 7059® or 1739® glass substrate, available from Dow Corning Corp. of Michigan and is well known to one skilled in the art. The glass substrate may include $SiO_2$, low temperature glass or high temperature quartz. Above glass substrate 106, there is disposed a layer stack, a portion of which is shown in FIG. 1A as a layer of indium tin oxide (ITO) layer 104. Above ITO layer 104, there is shown a photoresist layer 102.

It should be noted that the devices of the figures shown herein are depicted in a simplified format for illustration purposes only. There may be present other additional layers above, below, or in between the layers shown. Further, not all of the shown layers need necessarily be present and some or all may be substituted by other different layers. The layers of the devices shown and discussed herein are readily recognizable to those skilled in the art and may be formed using any of a number of suitable and known deposition processes, including chemical vapor deposition (CVD), plasma-etched chemical vapor deposition (PECVD), and a physical vapor deposition (PVD), such as sputtering.

During a typical ITO etching process, the photoresist layer is first patterned using an appropriate photoresist processing technique. By way of example, one such photoresist processing technique involves the patterning of photoresist layer 102 by exposing the photoresist material in a contact or stepper lithography system, and the development of the photoresist material to form a mask to facilitate subsequent etching. Using an appropriate etchant, the areas of ITO layer 104 that are unprotected by the mask are then etched away.

During etching, portions of photoresist layer 102, ITO layer 104, and portions of substrate 106 (by way of the etched through regions of ITO layer 104) may all be exposed to the etchant plasma that is used to etch the ITO layer 104. Unless a high selectivity between ITO and glass and/or photoresist is achieved by the ITO etch process, undue portions of the protective photoresist features and/or the underlying glass substrate may be inadvertently etched away, thereby adversely impacting the etch resolution of the ITO layer. Since the etch resolution of the ITO layer relates directly to the "quality" and/or operation of the resulting display device, a high selectivity etch process is thus desirable.

A high ITO to silicon nitride ($SiN_x$) selectivity is also desired as well. For discussion purposes, FIG. 1B shows a thin film array device 200, which may function as, for example, a light switch. In such a device, a portion of the ITO layer may be employed as a contact to the pixel electrode. Referring now to FIG. 1B, there is shown in device 200 a first electrode layer 204, which may include, for example, chromium and may be disposed on a glass substrate 202. Above first electrode layer 204, there may be disposed a gate dielectric layer 216, which may comprise, for example, silicon nitride and/or silicon dioxide.

Above gate dielectric layer 216, there is disposed an active layer 206, which may comprise, for example, amorphous silicon. An ohmic contact layer 208 may be disposed above gate dielectric layer 216. Ohmic contact layer 208 may include, for example, p-doped ($n^+$) amorphous silicon. Ohmic contact layer 208, in turn, may be disposed under a second electrode layer 210. A passivation layer 212, which may include silicon nitride ($SiN_x$), may be disposed above second electrode layer 210.

A contact hole 214 through passivation layer 212 permits a pixel electrode 218 to make electrical contact with underlying second electrode layer 210. Pixel electrode 218 may include ITO, and may be formed by a blanket deposition of the ITO material, followed by an etch back step to create pixel electrode 218.

During the etching of the blanket-deposited ITO layer to create pixel electrode 218, portions of the ITO are removed. Since portions of the ITO layer and passivation layer 212 may be exposed to the etchant plasma during the pixel electrode contact etch, however, some removal of passivation layer 212 may result. Because of the possibility of unwanted silicon nitride removal, a high ITO to silicon nitride selectivity is generally desirable.

In conventional ITO etching processes, dry etching is generally not favored because ITO etch products do not volatilize easily. The dry etch, when employed, is typically conducted in a high pressure (>100 milliTorr), low flux density plasma reactors, e.g., those employing parallel plates, where an etchant gas is introduced for etching. Further, prior art high pressure, low density, dry etching processes involve several known disadvantages. Prior art high pressure, low density etching processes using organic gases such as methane, acetone, ethanol, and methanol, for example, suffer from polymer formation due to a high concentration of hydrocarbon radicals within the discharge. During prior art ITO etching processes, these processes form volatile organometallic compounds, which adhere to the reactor interior and tend to be difficult to remove during chamber cleaning. In fact, their removal is generally an arduous and time consuming process, which lowers the throughput of the etch reactor.

On the other hand, etching processes that use halogens, such as chlorine, iodine and bromine, under the high pressure, low flux conditions of the prior art tend to yield very low etching rates and form solid etch by-products that are also difficult to remove. Etchant gases such as hydrogen bromide and hydrogen iodide may have been employed, but the high pressure, low density conditions under which they were employed in the prior art necessitate an additional step of pre-heating the substrate. Pre-heating the substrate, while making the ITO material more volatile and easier to etch, introduces an additional step into the etching process, which makes the prior art dry etching techniques less economically attractive. It is further discovered that preheating may damage or reticulate the protective photoresist features.

Some of these disadvantages have prompted the prior art ITO processes to generally favor a wet etch approach. As is known, however, the wet etch approach also suffers from several drawbacks. For example, the wet etch rates are low and may be highly dependent on the ITO sheet resistance. Additionally, the conditions associated with wet etching are often hazardous, with the disposal of the etching solutions posing a significant safety hazard.

Still further, uniform etching of the ITO layer by wet etching is often difficult to achieve. Also, the etch selectivity to the overlying photoresist and/or the layers surrounding the ITO layer, such as silicon nitride, may be poor with the wet etch technique. In the view of above, what is desired is an improved method and apparatus for efficiently etching the ITO layer in a plasma processing chamber.

SUMMARY OF THE INVENTION

To achieve the foregoing, the present invention provides a method for dry etching ITO using a low pressure plasma reactor.

The present invention relates, in one embodiment, to a method, in a low pressure, inductively coupled plasma reactor, for dry etching an indium tin oxide (ITO) layer disposed above a substrate. The method includes a step of placing the substrate having the ITO layer into the low pressure plasma reactor, a step of introducing an etchant gas into the low pressure plasma reactor, a step of striking a plasma from the etchant gas in the low pressure plasma reactor, and a step of etching the ITO layer with the plasma.

The present invention relates, in another embodiment, to a method, in a low pressure, inductively coupled plasma reactor for dry etching a substrate having an indium tin oxide (ITO) layer and a silicon nitride layer below the ITO layer. The method includes a step of placing the substrate with the ITO layer and the silicon nitride layer into the low pressure plasma reactor, a step of introducing an etchant source gas into said low pressure plasma reactor, a step of striking a plasma in the low pressure plasma reactor with the etchant source gas, and a step of etching the ITO layer with the plasma.

These and other features of the present invention will be described in more detail below in the detailed description of the invention and in conjunction with the following figures.

BRIEF DESCRIPTION OF THE DRAWINGS

FIG. 3 is a table showing, in accordance with one embodiment of the present invention, various reactor operation parameters that may be employed in TCP™ reactors to etch substrates containing indium tin oxide (ITO) or tin oxide.

FIG. 4 is a table showing, in accordance with one embodiment of the present invention, some of the results obtained by the present inventive etch process.

DETAILED DESCRIPTION OF THE PREFERRED EMBODIMENTS

An invention is described for etching an indium tin oxide (ITO) layer in a low pressure plasma reactor. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

The etching of an indium tin oxide (ITO) layer according to the present invention, as described hereinafter, may be carried out on any variety of substrates that include a layer of ITO. By way of example, the etching may be employed to etch 1.1 mm thick and 320×340 $mm^2$ rectangular glass substrates, which have at least one ITO layer. As a further example, the inventive technique may be employed to etch a layer of ITO layer disposed on a circular silicon wafer.

Figure 1A:
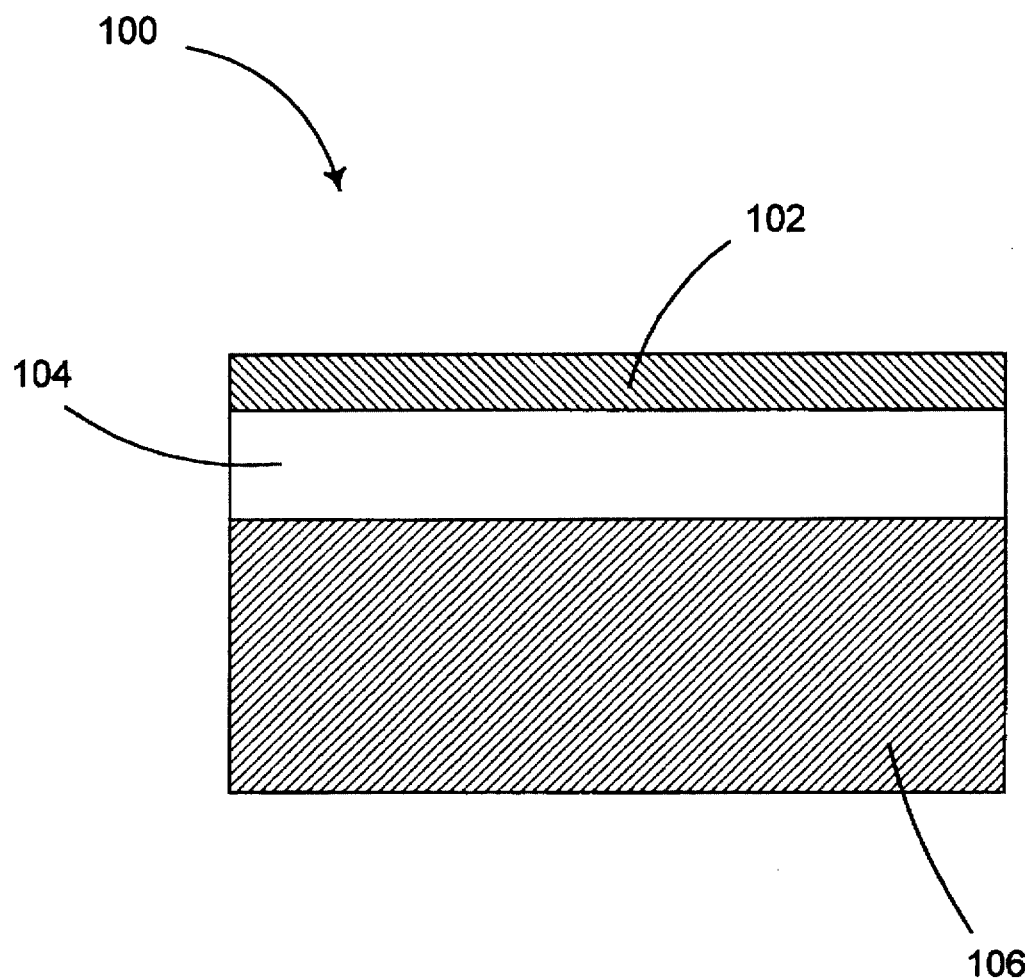
FIG. 1A shows, for illustration purposes, a side sectional view of a panel portion of a flat panel display that contains a layer of indium tin oxide (ITO).
Figure 1B:
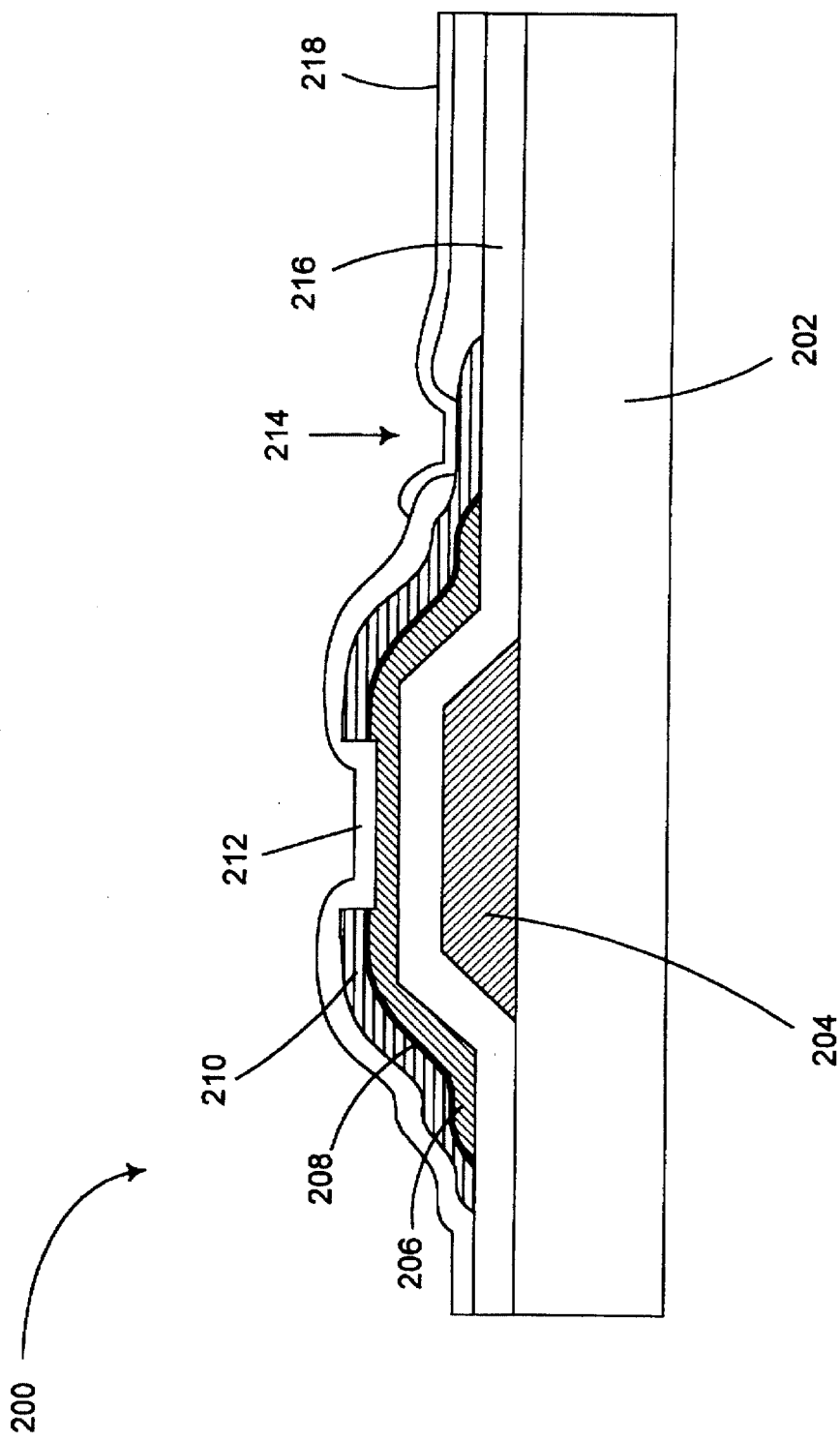
FIG. 1B shows, for discussion purposes, a side-sectional view of a single thin film transistor array, representing another device employing a layer of indium tin oxide (ITO).
Figure 2:
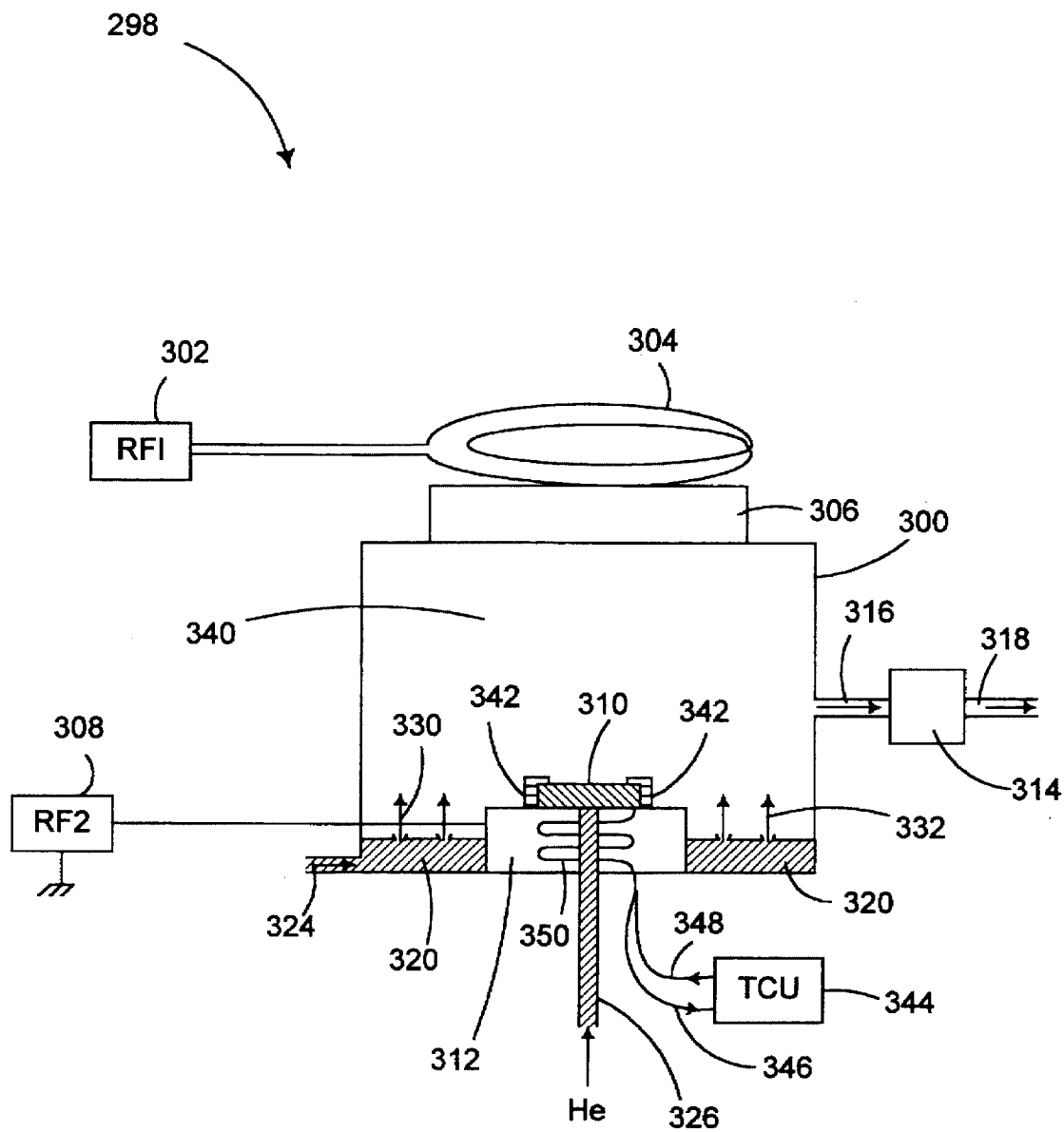
FIG. 2 is a cross-sectional view of a transformer coupled plasma (TCP™) reactor suitable for use in etching ITO or tin oxide in accordance with one embodiment of the present invention.

FIG. 2 is a representation of a transformer coupled plasma (TCP™) system, representing a low pressure, high density plasma processing system that may be employed to etch ITO in accordance with one aspect of the present invention. For ease of illustration, a TCP™ system known as the Continuum™, available from Lam Research Corporation of Fremont, Calif. is employed and described herein. It should be borne in mind, however, that the invention is not limited to this particular TCP™ system configuration. By way of example, it is believed that the invention may be practice in any high density, low pressure plasma reactors, including those employing a cyclotron resonance (ECR) system, a helicon, a helical resonator, or the like.

In FIG. 2, TCP™ system 298 has a reaction chamber 300. Above chamber 300, there is disposed a dielectric window 306 and a coil 304. Dielectric window 306 can be made of any suitable dielectric material. In one embodiment, however, it is made of quartz. Coil 304, which may be planar or shaped appropriately according to reactor configuration, may be energized by a RF generator 302, e.g., at 13.56 MHz or other suitable frequencies, typically via a matching network (not shown to simplify the illustration).

Inside reaction chamber 300, there is a plasma processing region 340, which is located between dielectric window 306 and substrate 310. A clamp 342 may be provided to secure substrate 310 on a chuck 312. Clamp 342 represents a mechanical clamp and may be omitted if electrostatic clamping is employed. In some instances, however, clamping may not be necessary. Chuck 312 is typically an aluminum work piece and preferably biased (also typically via a matching network) by a radio frequency generator 308. In one embodiment, RF generator 308 operates at a frequency of 13.56 MHz to produce a DC bias on substrate 310, which helps in directing the ions toward the substrate.

Chuck 312 may be equipped with a port 326 that extends from underneath chuck 312 into the substrate/chuck interface. Port 326 is employed to supply a heat transfer gas such as helium or some other gas to the substrate/chuck interface region to maintain the temperature of substrate 310 at a desired level during plasma processing.

Reaction chamber 300 has a gas inlet port 324 that may be connected to a gas dispenser 320 surrounding the base of chuck 312. Gas dispenser 320 may be a gas ring with openings 330 and 332 for venting source etchant gases into plasma processing region 340. Alternatively, gas dispenser 320 may assume any suitable configuration, e.g., a shower head. Further, both gas inlet port 324 and gas dispenser 320 may be disposed at any suitable location relative to the chamber.

In accordance with one aspect of the invention, the source etchant gases may include, for example, HBr, HCl, HI, $Br_2$, $I_2$ and/or $Cl_2$, or a mixture thereof. An additive, such as oxygen may be introduced and is believed to enhance the selectivity of ITO to other layers such as glass, photoresist, or silicon nitride.

A turbomolecular pump 314, which is equipped with an inlet 316 and an outlet 318, evacuates the gas in plasma processing region 340 and maintains a desired reactor pressure. Turbomolecular pump 314 is capable of evacuating a system such as Continuum™ typically down to a pressure of 0.1–100 milliTorr while still supplying about 200 to about 5000 sccm of reactant gas.

In one embodiment of the present invention, chuck 312 may be equipped with a temperature control unit (TCU) 344, which has a fluid inlet port 346 and a fluid outlet port 348. Through these ports, a fluid such as glycol or deionized water, is supplied at an appropriate temperature to chuck 312 to maintain chuck 312 at a desired temperature.

A typical etch process in TCP system 298 begins when substrate 310 is secured, e.g., by mechanical or electrostatic clamp 342, on chuck 312 inside reaction chamber 340. A source etchant gas is introduced into reaction chamber 300 via gas inlet port 324, which travels through gas ring 320 and is released through openings 330 and 332.

At least RF generator 302 may be turned on to energize coil 304, which acts as an electrode. In addition, RF generator 308 may be turned on to energize chuck 312 to act as a second electrode. The RF energy from coil 304 is transmitted through the dielectric window 316 and enters the plasma processing region 340 where it converts the gas in reaction chamber 300 to a plasma state and thereby ignites a plasma. If chuck 312 is energized, then the energy from this chuck/electrode further imparts additional momentum to ions in the plasma towards the substrate.

As is apparent, chuck 312 and substrate 310 together with the plasma act as a type of diode. When chuck 312 is energized by RF generator 308, it rectifies the RF to produce a sheath of negatively charged DC voltage at the top of the substrate. The substrate surface is, thus, biased negatively to attract the ions toward the substrate surface where they bombard the substrate surface at an energy largely determined by the bias voltage. This action enhances the etching of ITO and to some extent etches any other layer exposed to the etchant plasma.

Etching of the ITO layer may continue until a stop point is reached. In one embodiment, a narrow band optical filter (or a monochrometer) in conjunction with a photodiode sensitive to the appropriate wavelength region may, for example, be employed to monitor the optical emission from the indium in the plasma. Completion of the ITO etch may be determined when a significant decrease in the 410 nm emission is observed.

FIG. 3 is a table that sets forth, in accordance with one embodiment of the present invention, the approximate parameters employed to etch ITO films deposited on 320× 340 $mm^2$ glass substrate. The parameters of the ITO etching process shown in FIG. 3 include pressure, plasma density, RF bias power (i.e., power to the chuck electrode), and flow rates. FIG. 3 also includes chuck temperature, representing the optional parameters that may be controlled to achieve more favorable ITO etches. Approximate scaling of the parameters, e.g., bias/$cm^2$ and/or flow/$cm^2$, may be performed, as can be appreciated by those skilled in the art, to accommodate other substrate sizes and/or chamber volumes.

Pressure refers to the pressure measured inside plasma reactor 300 during etching. If the pressure is too low, there might be an inadequate supply of reactants for etching the substrate, thereby resulting in a low etch rate. In contrast, if the pressure is high, it is difficult to achieve the required ion flux and ion energy and the result is often a lower selectivity among the layers, e.g., between the ITO layer and its neighboring layers that may be exposed to the etchant plasma. The optimal pressure, therefore, represents one that provides the best combination of a high ITO etch rate and high selectivity of ITO to neighboring layers. In general, however, the invention employs significantly lower pressure than employed in the prior art. In one embodiment, the pressure of the source etchant gas ranges from about 0.1 milliTorr to about 100 milliTorr, preferably ranges from about 3 to about 15 milliTorr, and more preferably is at about 5 milliTorr.

Plasma density refers to the density of the positive ions within plasma processing region 340. Plasma density is a function of the power output of the RF generator 302 (i.e., the TCP™ power). A higher TCP power tends to generate a higher density of plasma which, depending on other parameters, may increase the etch rate of ITO by producing a large flux of ions to the substrate surface. In one embodiment, however, the invention operates with significantly higher plasma density than the prior art. In accordance with one aspect of the present invention, the plasma density generally ranges from about 1E10 to about 1E12 $cm^{-3}$, preferably ranges from about 5E10 to about 5E11 $cm^{-3}$, and more preferably is at about 1E11 $cm^{-3}$. In contrast, prior art ITO dry etches typically employ plasma density of less than 1E10 $cm^{-3}$.

The RF bias power is defined as the power output by the RF generator 308. In Table 3, the RF bias power is shown in units of Watts and Watts per square centimeter of substrate. The RF bias power determines the energy at which positive ion flux impinges the substrate surface. An appropriate level of RF bias power allows for enough ion energy to remove the ITO from the substrate without degrading selectivity to other layers. The RF bias power, scaled for etching 320×340 $mm^2$ substrates, generally ranges from about 100 to 4000 Watts, preferably ranges from about 500 to 2500 Watts, more preferably is at about 1250 Watts. In Watts per square centimeter of substrate, the RF bias power generally ranges from about 0.09 to about 3.7 Watts/$cm^2$ of substrate, preferably ranges from about 0.46 to about 2.30 Watts/$cm^2$, and more preferably is about 1.15 Watts/$cm^2$. If a larger substrate is employed, the RF bias power may be scaled accordingly to provide satisfactory etch results.

In the aforementioned Continuum™ plasma processing reactor, the plasma density may be controlled by the TCP power, and the bias on the substrate is controlled by the bottom power. While the two power sources may affect each other, one may be left constant while the other is adjusted.

In the present invention, the ion bombardment of substrate 310 may accordingly be controlled by varying the power output of RF generator 308 and keeping the power output of RF generator 302 constant. In this manner, the present invention is capable of etching the layer stack including ITO on substrate 310 under conditions of controlled ion bombardment without affecting other reaction parameters e.g., pressure or flux density that might detrimentally affect the etch characteristics.

The frequency of RF generator 308 may range from between about 100 KHz to about 40 MHz to produce the desired level of ion bombardment energies, which may be typically in the range of about 100 to about 400 Volts. In one embodiment, as mentioned earlier, the frequency of RF generator 308 is generally at 13.56 MHz. This unique feature of being able to independently control ion bombardment without affecting other reaction parameters that might detrimentally affect the etch characteristics, e.g., pressure or flux density, provides the present invention with a distinct advantage over the traditional methods.

Flow rate refers to the flow rate of the source etchant gases into reaction chamber 300 and may be adjusted. For etching 320×340 mm$^2$ substrates, the flow rate generally ranges between about 40 to about 2000 sccm, preferably ranges between about 100 to about 1000 sccm and more preferably is at about 200 sccm. In terms of sccm per square centimeter of substrate, the flow rate generally ranges from about 0.04 to about 1.84 sccm/cm$^2$, more preferably ranges from about 0.092 to about 0.92 sccm/cm$^2$ and more preferably is about 0.18 sccm/cm$^2$. As mentioned earlier, the etchant gases may include, for example, HBr, HCl, HI, Br$_2$, I$_2$, and/or Cl$_2$. In one embodiment, where an additive such as oxygen is added to the etchant gas, the flow rate of the additive may account for about 5% to about 10% of the total flow rate of the total etchant flow rate.

The traditional method of plasma (or dry) etching ITO requires preheating the substrate, e.g., to 200° C. or above, by plasma or heaters to facilitate etching as the byproducts (e.g., indium hallide) of the ITO etch are not generally volatile at low temperatures. Although the preheat step may succeed in rendering etch products more volatilized, the photoresist, along with the ITO, also undesirably undergoes degradation. Thus, a high etch rate for the ITO layer comes at the expense of maintaining photoresist features.

In accordance with one aspect of the present invention, it is discovered that the etching of an ITO layer in a low pressure, high density plasma processing chamber at a substrate temperature below about 150° C., particularly below 80° C., unexpectedly and surprisingly, prevents excessive photoresist degradation and while maintaining a high ITO etch rate. In one embodiment, the chuck's temperature may be maintained, e.g., via TCU unit 344, from about 40° C. to about 80° C., which causes to the substrate's temperature to be within this same range. In another embodiment, the chuck's temperature may be maintained at about 40° C., thereby causing the substrate's temperature to be at about 40° C. as well. The present invention uses a high ion flux to remove ITO byproduct from the surface of the panel without requiring heating of the entire panel. High ion flux liberates the ITO etch product from the surface and low pressure, high conductance operation allows the product to be pumped out of the chamber without redepositing on the substrate.

Under the low pressure, high density conditions of the present invention, it has been found that it is possible to achieve ITO etch rates in the range of between about 1,500 to about 4,000 Angstroms/minute. Advantageously, these ITO etch rates are approximately an order of magnitude higher than those achievable by prior art ITO etching methods. More significantly, unlike the prior art methods of ITO etching, the high etch rates obtained by the inventive etching technique does not come at the expense of a low ITO to glass and/or silicon nitride and/or photoresist selectivity.

The inventive ITO etch technique further provides superior etch uniformity over prior art ITO techniques due to the use of a uniform ion flux and control of substrate temperature (via control of the chuck's temperature). In one embodiment, etch uniformity ranges from about 5% to about 10% of the mean etch rate. Etch uniformity is defined as (Max−Min)/(Max+Min)×100%, where Max represents the maximum etch rate and Min represents the minimum etch rate across the etched surface. Since a highly uniform etch is generally desirable, the above result further highlights an additional advantage of the low pressure, high density etch technique of the present invention.

The ability to more consistently obtain the desired etch profile for the ITO sidewall is another advantage of the present invention. In one embodiment, the ITO etch profile may have a taper angle from about 45° to about 90°. The taper angle is believed to be a function of the photoresist, which may itself have a pre-etch taper angle of typically about 70°. More importantly, it is observed that there is no undercutting of the ITO layer. The absence of ITO layer undercutting further shows the advantage of the present invention over prior art ITO etch techniques, which is generally performed in a more isotropic manner under conditions of higher pressures (prior art dry etching or wet chemistry).

FIG. 4 illustrates some observed results, which are obtained by etching various ITO-bearing substrate samples using the inventive low pressure, high density etch technique. For some samples, it is possible to achieve an ITO etch rate of, for example, about 4000 Angstroms/minute. The ITO to photoresist etch selectivity can be, in some samples, about 3:1, and the ITO to glass layer may be, in some samples, about 10:1. Further, the ITO to silicon nitride etch selectivity may also be, in some samples, 10:1, and the etch profile may range, in some samples, from about 45° to about 90° with almost no observable undercutting of the ITO layer. The etch rate uniformity may be, in some samples, about 5% of the mean etch rate.

In the following examples, some etch results are obtained when TCP™ power and RF bias power (corresponding to power supplied to the top and bottom electrode respectively) are varied while etch a 320×340 mm$^2$ ITO-bearing substrate. The examples serve only to illustrate how power may be advantageously varied to optimize etch results and are not intended to limit the scope of the invention in anyway.

EXAMPLE 1

In Table 1, the ITO etch behavior of a 145×145 mm$^2$ sample for Cl$_2$ and HBr processes were studied as a function of RF generator 302 power, also known as "TCP power," and RF generator 308 power, also known as RF bias power. The following parameters were kept constant: pressure of the source etchant gas (at about 5 milliTorr); flow rate of source etchant gas (at about 100 sccm); and chuck's temperature (at about 40° C.). Selectivity was also monitored for these processes.

As mentioned, the etch of Table 1 is performed on a 145 mm×145 mm substrate sample using the Lam Research TCP™ 9400 plasma etching machine, which has about 20% in chamber volume of typical machines employed for etching 320 mm×340 mm substrates. Certain parameters may be scaled to the reactor's volume and/or substrate size to facilitate etching on different reactors and different substrates. By way of example, the TCP power shown in Table 1 may be scaled, linearly in one embodiment, with the reactor volume to maintain substantially the same ion density value across different reactors.

In Table 1, although the ITO etch rates are essentially the same for both chemistries, the ITO to photoresist selectivity is almost an order of magnitude greater for processes employing HBr chemistry for some power settings. At the highest power condition, 600 Watts of TCP power and 300 Watts of RF bias power, ITO etch rate in excess of 2500 Angstroms/minute (Å/min) is achieved with the HBr process, with an associated ITO to photoresist selectivity of 0.9:1. As is apparent from the foregoing, improved etch rates and/or selectivities may be achieved by appropriately modifying the total amount of power as well as the ratio of top to bottom power. By way of example, the following values for bottom power/cm$^2$ of substrate 0.24, 0.48, 0.95, and 1.43 may be scaled, in one embodiment linearly, to accommodate different substrate sizes and/or chamber volumes.

The etch profile for the processes employing HBr has a taper angle of between about 55° and about 60° (with a pre-etch photoresist angle of 70°).

to the source etchant gas. For example, the selectivity of ITO to glass may increase to about 4:1 while still maintaining an ITO etch rate of about 1710 Å/min by the addition of 10 sccm of oxygen as an additive to the source etchant gas.

While this invention has been described in terms of several preferred embodiments, there are alterations, permutations, and equivalents which fall within the scope of this invention, e.g. tin oxide, instead of ITO, could be etched just as easily by the teachings of present invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for dry etching an indium tin oxide (ITO) layer disposed above a substrate, said method comprising:
    placing said substrate having said ITO layer into a low pressure plasma reactor;
    introducing an etchant gas into said low pressure plasma reactor;
    striking a plasma from said etchant gas in said low pressure plasma reactor; and
    etching said ITO layer with said plasma with a pressure below about 100 milliTorr within said low pressure plasma reactor.

TABLE 1

| TCP Power (Watts)/RF Bias Power (Watts) | HBr CHEMISTRY | | | Cl$_2$ CHEMISTRY | | |
|---|---|---|---|---|---|---|
| | Indium Tin Oxide Etch Rate (Å/min) | Photoresist Etch Rate (Å/min) | Indium Tin Oxide: Photoresist Selectivity | Indium Tin Oxide Etch Rate (Å/min) | Photoresist Etch Rate (Å/min) | Indium Tin Oxide: Photoresist Selectivity |
| 200/50 | 360 | 200 | 1.8:1 | 390 | 2500 | 0.2:1 |
| 300/100 | 900 | 500 | 1.8:1 | 750 | 5000 | 0.2:1 |
| 400/200 | 1600 | 2065 | 0.8:1 | 1500 | 6000 | 0.3:1 |
| 600/300 | 2570 | 2832 | 0.9:1 | 2400 | 6740 | 0.4:1 |

EXAMPLE 2

A substrate containing an ITO layer was etched in a low pressure etch reactor utilizing a TCP™ source and designed for 320 mm×340 mm substrate. HBr and Cl$_2$ etchant source gases were employed under the following conditions: pressure of the source etchant gas=8 milliTorr; TCP power=3000 Watts; RF bias power 1000 Watts (0.92 Watts/cm$^2$); flow rate of HBr=200 sccm; flow rate of Cl$_2$=200 sccm; temperature of chuck electrode=40° C.; helium pressure in helium port 326=6 Torr. The optical endpoint for this process was detected using the 410 nm indium emission intensity. The following results were obtained: etch rate of ITO at about 2330 Å/min; etch uniformity within about 6.1% of the mean; etch profile at about 70° taper angle; and selectivity of ITO to glass of about 2.5:1.

It was observed that near this range of operating parameters, the selectivity to glass appears to increase when RF bias power is reduced. For example, the selectivity of ITO to glass can be increased from about 2.5:1 to about 3.6:1 while still maintaining an ITO etch rate of about 1300 Å/min by decreasing the RF bias power from about 1000 Watts to 300 Watts. Consequently, decreasing the RF bias power appears to be one advantageous technique of improving the ITO to glass selectivity without unduly lowering the ITO etch rate.

The selectivity of ITO to glass may further increase by adding or increasing the amount of oxygen, as an additive, 2. The method of claim 1, wherein said low pressure plasma reactor is a low pressure, high density plasma reactor.

3. The method of claim 2, wherein said low pressure, high density plasma reactor is a transformer coupled plasma reactor.

4. The method of claim 1, wherein said low pressure plasma reactor is a low pressure inductively coupled plasma reactor.

5. The method of claim 1, wherein said substrate's temperature is below about 150° C.

6. The method of claim 1, wherein said substrate's temperature is between about 40° C. to about 80° C.

7. The method of claim 1, wherein said substrate's temperature is about 40° C.

8. The method of claim 1, wherein said substrate comprises a layer of silicon nitride under said ITO layer.

9. The method of claim 1, wherein said substrate comprises a photoresist layer above said ITO layer.

10. The method of claim 9 wherein said substrate further comprises a layer of glass under said ITO layer.

11. The method of claim 1 wherein said etching step is conducted under a chamber pressure of between about 0.1 and about 100 milliTorr.

12. The method of claim 11 wherein said etching step is conducted under a chamber pressure of between about 3 and about 15 milliTorr.

13. The method of claim 12 wherein said etching step is performed under a plasma density between about 5E10 to about 5E11 cm$^{-3}$.

14. The method of claim 1 wherein said etching step is conducted under a chamber pressure of about 5 milliTorr.

15. The method of claim 1 wherein said etching step is performed under a plasma density between about E10 to about E12 cm$^{-3}$.

16. The method of claim 15 wherein said etching step is performed under a plasma density between about 5E10 to about 5E11 cm$^{-3}$.

17. The method of claim 1 wherein said etchant gas includes one or more selected from the group consisting of HBr, HCl, HI, Br$_2$, I$_2$ and Cl$_2$.

18. The method of claim 1 wherein sad etchant gas further includes an oxygen additive.

19. A method for dry etching a glass substrate having an indium tin oxide (ITO) layer disposed thereon, the method comprising:

placing said glass substrate with said ITO layer into a low pressure plasma reactor;

introducing an etchant source gas into said low pressure plasma reactor;

striking a plasma in said low pressure plasma reactor with said etchant source gas; and etching said ITO layer with said plasma with a pressure below about 100 milliTorr within said low pressure plasma reactor.

20. The method of claim 19 wherein said etching step is conducted under a chamber pressure of between about 3 and about 15 milliTorr.

21. The method of claim 19 wherein said etching step is performed under a plasma density between about 5E10 to about 5E11 cm$^{-3}$.

22. The method of claim 19, wherein said glass substrate's temperature is below about 150° C. during said etching step.

23. A method for fabricating an electronic device from a substrate comprising a silicon nitride layer disposed above said substrate, and a tin oxide-containing layer disposed above said silicon nitride layer, the method comprising:

placing said substrate with said tin oxide-containing electrode layer and said silicon nitride layer into a low pressure, inductively coupled plasma reactor;

introducing an etchant source gas into said low pressure, inductively coupled plasma reactor;

striking a plasma in said low pressure, inductively coupled plasma reactor with said etchant source gas; and etching said tin oxide-containing transparent electrode layer with said plasma.

24. The method of claim 23 wherein said tin oxide-containing layer further comprises indium.

25. The method of claim 23 wherein said tin oxide-containing layer represents a transparent electrode layer.

26. The method of claim 23 wherein said etching step is conducted under a chamber pressure of between about 3 to about 15 milliTorr.

27. The method of claim 23 wherein said etching step is performed under a plasma density between about 5E10 to about 5E11 cm$^{-3}$.

28. The method of claim 23 wherein said substrate's temperature is below about 80° C. during said etching step.

29. The method of claim 23 wherein said etchant source gas comprises HBr.

30. The method of claim 23 wherein said etchant source gas comprises Cl$_2$.

31. The method of claim 23 wherein said etchant source gas comprises O$_2$ and an etchant, said etchant being one of HBr and Cl$_2$.

32. A method for dry etching an indium tin oxide (ITO) layer disposed above a substrate, said method comprising:

placing said substrate having said ITO layer into a low pressure plasma reactor;

introducing an etchant gas into said low pressure plasma reactor;

striking a plasma from said etchant gas in said low pressure plasma reactor; and etching said ITO layer with said plasma under a chamber pressure of between about 3 and about 15 milliTorr.

33. The method of claim 32, wherein said low pressure plasma reactor is a transformer coupled plasma reactor.

34. The method of claim 32, wherein said low pressure plasma reactor is a low pressure inductively coupled plasma reactor.

35. The method of claim 32, wherein said substrate's temperature is below about 150° C. in said etching.

36. The method of claim 35, whereto said substrate's temperature is between about 40° C. to about 80° C. in said etching.

37. The method of claim 36, wherein said substrate's temperature is about 40° C. in said etching.

38. The method of claim 36, wherein said substrate further comprises a layer of glass under said ITO layer.

39. The method of claim 36, wherein said etching step is performed under a plasma density between about 5E10 to about 5E11 cm$^{-3}$.

40. The method of claim 36, wherein said etching step is conducted under a chamber pressure of between about 0.1 and about 100 milliTorr.

41. The method of claim 40, whereto said etching step is performed under a plasma density between about 5E10 to about 5E11 cm$^{-3}$.

42. The method of claim 32, whereto said substrate comprises a layer of silicon nitride under said ITO layer.

43. The method of claim 32, wherein said substrate comprises a photoresist layer above said ITO layer.

44. The method of claim 32, wherein said etching step is conducted under a chamber pressure of about 5 milliTorr.

45. The method of claim 32, wherein said etching step is performed under a plasma density between about E10 to about E12 cm$^{-3}$.

46. The method of claim 45, wherein said etching step is performed under a plasma density between about 5E10 to about 5E11 cm$^{-3}$.

47. The method of claim 32, wherein said etchant gas includes one or more selected from the group consisting of HBr, HCl, HI, Br$_2$, I$_2$, and Cl$_2$.

48. The method of claim 32, wherein said etchant gas further includes an oxygen additive.

* * * * *

UNITED STATES PATENT AND TRADEMARK OFFICE
CERTIFICATE OF CORRECTION

PATENT NO.   : 5,667,631
DATED        : September 16, 1997
INVENTOR(S)  : Holland et al.

It is certified that error appears in the above-indentified patent and that said Letters Patent is hereby corrected as shown below:

Title page,
Attorney, Agent or Firm name should be changed from "Hickman Peyer & Weaver" to --Hickman Beyer & Weaver--.

Signed and Sealed this

Tenth Day of March, 1998

*Attest:*

BRUCE LEHMAN

*Attesting Officer*                *Commissioner of Patents and Trademarks*